(12) United States Patent
Shumarayev et al.

(10) Patent No.: US 7,688,106 B1
(45) Date of Patent: Mar. 30, 2010

(54) HIGH-SPEED SERIAL INTERFACE CIRCUITRY FOR PROGRAMMABLE LOGIC DEVICE INTEGRATED CIRCUITS

(75) Inventors: Sergey Shumarayev, Los Altos Hills, CA (US); Thungoc M. Tran, San Jose, CA (US); Simardeep Maangat, Sunnyvale, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/712,609

(22) Filed: Feb. 27, 2007

(51) Int. Cl.
*H03K 19/173* (2006.01)

(52) U.S. Cl. ............................ 326/38; 326/41; 326/82; 375/221; 710/71

(58) Field of Classification Search ............ 326/37–47; 375/220–224, 229–232; 341/100–101; 710/71, 710/305; 370/248–249, 360, 366, 412, 503–506
See application file for complete search history.

(56) References Cited

U.S. PATENT DOCUMENTS

| | | | |
|---|---|---|---|
| 6,777,979 B1 * | 8/2004 | Zhu et al. ..................... | 326/41 |
| 7,002,368 B2 * | 2/2006 | Lee et al. ...................... | 326/38 |
| 7,050,777 B2 * | 5/2006 | Cai .............................. | 455/295 |
| 7,099,278 B2 * | 8/2006 | Momtaz ....................... | 370/249 |
| 7,242,221 B1 * | 7/2007 | Hoang et al. .................. | 326/82 |
| 7,474,612 B1 * | 1/2009 | Patel ........................... | 370/217 |

OTHER PUBLICATIONS

U.S. Appl. No. 11/256,346, Shumarayev et al.

\* cited by examiner

*Primary Examiner*—Vibol Tan
*Assistant Examiner*—Christopher Lo
(74) *Attorney, Agent, or Firm*—Ropes & Gray LLP; Robert R. Jackson

(57) ABSTRACT

High-speed serial interface ("HSSI") transceiver circuitry (e.g., on a programmable logic device ("PLD") integrated circuit) includes input buffer circuitry with adaptive equalization capability. The transceiver circuitry also includes an output driver, which may include pre-emphasis capability (preferably controllably settable). Selectively usable loop-back circuitry is provided for allowing the output signal of the input buffer to be applied substantially directly to the output driver. The loop-back circuitry may include a loop-back driver, which may be turned on substantially only when needed for loop-back operations.

12 Claims, 3 Drawing Sheets

HIGH-SPEED SERIAL INTERFACE CIRCUITRY FOR PROGRAMMABLE LOGIC DEVICE INTEGRATED CIRCUITS

BACKGROUND OF THE INVENTION

This invention relates to programmable logic device ("PLD") integrated circuits, and more particularly to high-speed serial interface ("HSSI") circuitry for use on PLDs.

It is increasingly common for PLDs to include HSSI circuitry for use in enabling the PLD to receive and/or transmit high-speed serial data signals from or to other devices in a system that includes the PLD. On the receiver side, such HSSI circuitry may begin with (or include at an early point or stage) some automatic or adaptive equalization capability or circuitry. Such "front end" equalization capability helps to improve the condition of the received serial data signal so that it can be more accurately interpreted by subsequent circuitry on the PLD. Among the possible objectives of such equalization circuitry may be to sharpen the distinction between the two binary states of the received signal. This may include attempting to make transitions in the received signal steeper and/or stronger, and/or increasing the fraction of time that the received signal is in one or the other of its two binary states (i.e., not in transition between those states). Improving the condition of the received signal in respects such as these can improve the ability of downstream circuitry on the PLD to correctly recover clock and/or data information from the received signal, especially from received signals having high data rates and relatively low voltage swing between high and low states. Such downstream circuitry can include clock and data recovery ("CDR") circuitry, and it is important for such circuitry to avoid inter-symbol interference ("ISI") (i.e., inability of the circuitry to correctly distinguish each successive data bit from the adjacent bits, especially an immediately adjacent bit having a different value).

Because PLDs are typically designed to be relatively general-purpose devices, it is often not known in advance exactly what will be the characteristics of the various systems in which the PLD may be used. Signal transmission characteristics can be different in different types of systems. To enable the PLD to provide the best possible performance in any of several different systems, the PLD may be equipped with equalization circuitry of the type mentioned above that can automatically adapt its performance to best equalize the signal it receives in a particular system. The sophistication of such adaptive or automatic equalization circuitry may lead to a need or desire to test the performance of that circuitry separate from other circuitry on the PLD.

SUMMARY OF THE INVENTION

In accordance with the invention, high-speed serial interface ("HSSI") transceiver circuitry (e.g., on a programmable logic device ("PLD") integrated circuit) includes input buffer circuitry with adaptive equalization capability. The transceiver circuitry also includes an output driver, which may include pre-emphasis capability (preferably controllably settable). Selectively usable loop-back circuitry is provided for allowing the output signal of the input buffer to be applied substantially directly to the output driver. The loop-back circuitry preferably includes a loop-back driver. This loop-back driver may be turned on substantially only when needed for loop-back operation. An alternative loop-back connection to the output driver may be provided from data recovery (e.g., CDR) circuitry, which is downstream from the input buffer.

Further features of the invention, its nature and various advantages, will be more apparent from the accompanying drawings and the following detailed description.

DETAILED DESCRIPTION

Figure 1:
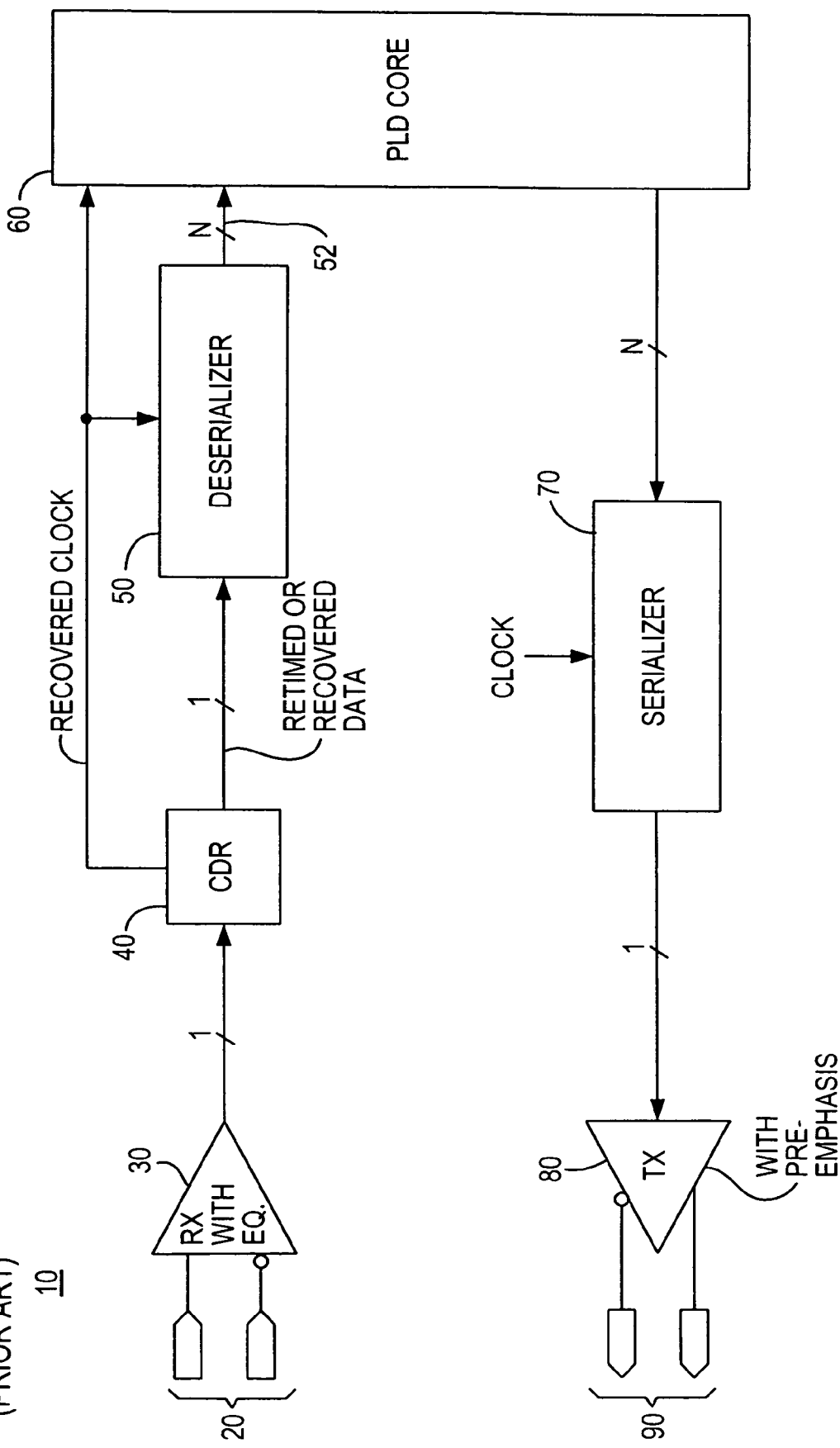
FIG. 1 is a simplified schematic block diagram of known HSSI circuitry that does not include the invention.

As additional background, illustrative circuitry that does not include the invention is shown in FIG. 1. This circuitry is one channel of high-speed serial interface ("HSSI") circuitry 10. A serial data signal can be applied to input pins 20 in differential form. Element 30 is input buffer circuitry that includes equalization capability. Preferably, this equalization capability includes automatic or adaptive equalization aspects, which may be controlled (at least in part) by adaptive dispersion compensation engine ("ADCE") circuitry. Thus element 30 may include the ability to examine various characteristics of the incoming serial data signal and modify that signal to improve its condition for further processing by downstream circuitry in channel 10. Examples of respects in which element 30 may thus modify (i.e., automatically or adaptively equalize) the incoming serial data signal are described in the earlier background section of this specification.

The output signal of element 30 (which is still a serial data signal) is applied to clock and data recovery ("CDR") circuitry 40. This circuitry operates on the applied serial data signal to recover clock and data information from that signal. The recovered clock signal may be applied to deserializer 50 and also to the core logic circuitry 60 of the programmable logic device ("PLD") integrated circuit that includes HSSI circuitry 10. The recovered data information (referred to as retimed or recovered data) is also applied to deserializer 50. Deserializer 50 uses the recovered clock signal (possibly directly as a high frequency clock, and also after division (e.g., by integer N) as a low frequency clock) to convert the serial retimed or recovered data to parallel form on bus 52 for application to PLD core 60. (PLD core 60 may receive either or both of the recovered clock signal and the above-mentioned low frequency clock signal (derived from the recovered clock signal).)

Although circuitry 40 is generally referred to herein as CDR circuitry, it may have any of several different operating modes. For example, if a properly synchronized reference clock signal is available from another source, circuitry 40 may not need to recover a clock signal from the incoming serial data signal. In that case, (1) circuitry 40 may operate primarily as data recovery circuitry, (2) the "retimed or recovered data" output of circuitry 40 may be adequately referred to as just "data" or "recovered data", and (3) the "recovered clock" output of circuitry 40 may be adequately referred to as just "clock." Thus a more generic characterization of circuitry 40 may be just "data recovery circuitry." All of this is also true for the similar circuitry 40 in FIG. 2.

Figure 2:
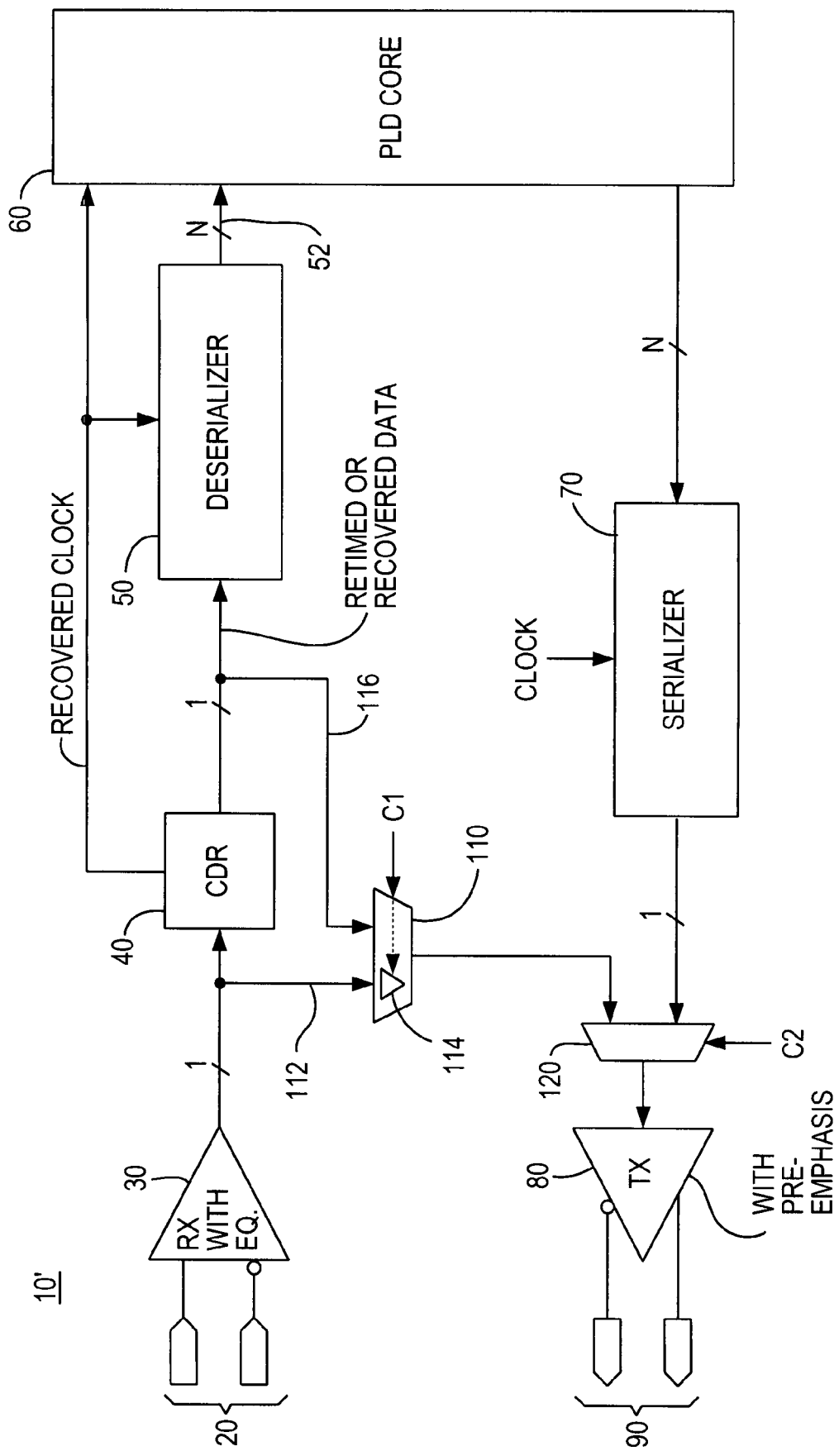
FIG. 2 is a simplified schematic block diagram showing an illustrative embodiment of modification of the FIG. 1 circuitry in accordance with the invention.

An illustrative construction of CDR circuitry 40 is shown in Shumarayev et al. U.S. patent application Ser. No. 11/256, 346, filed Oct. 20, 2005. In FIG. 2 of that reference it will be understood that another input to the data latch is the output signal of the input signal receiver.

The portion of HSSI circuitry 10 that has been described thus far is the receiver side of that circuitry. HSSI circuitry 10 also includes a transmitter side, which will now be described in the next paragraph.

On the transmitter side HSSI circuitry 10 includes serializer circuitry 70 for converting parallel data output by PLD core 60 to serial form. To do this, serializer 70 may use one or more clock signals, which may come from PLD core 60 and/or from one or more other sources. The serial data signal output by serializer 70 is applied to output driver circuitry 80, which may include circuitry for giving the output signal a controllable amount of pre-emphasis. For example, such pre-emphasis may include giving the output signal extra energy immediately after each transition in the binary level of that signal. PLD core 60 and/or other programmable circuitry may be used to control the kind (e.g., duration) and amount (e.g., magnitude) of the pre-emphasis that circuitry 80 gives to the signal it outputs. A purpose of such pre-emphasis may be to compensate (in advance) for anticipated attenuation of the output signal in the transmission medium to which the output signal is applied. Circuitry 80 applies its output to output pins 90 in differential form.

An illustrative embodiment of circuitry of the type shown in FIG. 1 to which circuitry in accordance with the invention has been added is shown in FIG. 2. Modified HSSI channel 10' (FIG. 2) includes all of the elements shown in FIG. 1, operating in the same way as described above in connection with FIG. 1. In addition, circuitry 10' includes several selectively usable loop-back elements. Multiplexer circuitry 110 allows either the serial data output signal of element 30 or an output signal of CDR circuitry 40 to be selected for application to multiplexer circuitry 120 in the transmitter side of channel 10'. Although FIG. 2 shows the retimed or recovered data output of CDR 40 as the second input 116 to multiplexer 110, that second input could instead be any desired intermediate signal in CDR 40. Multiplexer circuitry 110 is controllable by its control input signal(s) C1 to select either one of its primary or selectable input signals (i.e., from element 30 or element 40) as its output signal that is applied to one of the primary or selectable inputs to multiplexer 120. The other primary or selectable input to multiplexer 120 is the serial data output signal of serializer 70. Multiplexer 120 is controllable by its control input signal(s) C2 to select either one of its primary or selectable input signals as its output signal that is applied to transmitter driver 80.

From the foregoing it will be seen that the loop-back circuit elements of this invention allow anyone testing or using the circuitry to closely observe the performance and functioning of various "front end" portions of the circuitry more or less by themselves and prior to involvement of all of the further downstream circuitry. For example, the output of element 30 can be applied through multiplexers 110 and 120 to output driver 80 and thereby output from the device almost immediately and with very little latency (delay) in passing through the device that includes the FIG. 2 circuitry. This can be used, for example, to test various capabilities of element 30 (e.g., for such purposes as sorting devices that have been fabricated into groups having different ranges of adaptive equalization capability). Another example of use of this type of loop-back may occur closer to final use of the device and may be for such purposes as making sure that, in a particular system or system configuration, element 30 is operating properly (e.g., it is providing good equalization of the signal it receives, it is converging properly to such a result, and/or it is stable).

Still another example of use of loop-back from element 30 through multiplexers 110 and 120 to output driver 80 is the following. This pathway allows the device that includes circuitry 10' to be used as a link equalizer in a system that requires retransmission of a signal or at-speed splitting of a signal to multiple destinations. For example, the signal applied to element 30 can be equalized (e.g., automatically or adaptively) by that element and then almost immediately output via elements 110, 120, and 80 (with pre-emphasis, if desired), with no other use being made of the signal on the device that includes circuitry 10'. This is "link equalizer only" use of circuitry 10'. (Of course, other parts of the PLD that includes circuitry 10' may be used at the same time for other purposes.) Alternatively, the signal output by element 30 can be both output via the immediately above-described loop-back and also passed on via CDR 40, etc., for use on the PLD that includes circuitry 10'. This allow the device to split incoming signal 20 for multiple destinations, one such destination being the FIG. 2 device itself, and another destination being another device that is connected to output 90. Note again that the second device receives the split signal with the benefit of the link equalization (possibly also with pre-emphasis) provided by the elements (30, 110, 120, and 80) employed in the link.

As an alternative to the above loop-back substantially directly from element 30 to element 80, some or all of CDR circuitry 40 can be included in the loop-back by selecting the other input 116 to mux 110.

Recapitulating at least some aspects of the above, the additional diagnostic HSSI RX front-end feature illustrated by FIG. 2 allows for (1) system inter-symbol interference ("ISI") monitoring, as well as a debug feature that can be employed by users of devices that include this circuitry; (2) equalizer and adaptive dispersion compensation engine ("ADCE") convergence monitoring, as well as a tester point for use by a manufacturer of devices including this feature; and (3) ability to utilize the transceiver as (a) a link-equalizer-only in systems that require re-transmission, or (b) for at-speed signal splitting to multiple destinations.

As shown in FIG. 2, multiplexer circuitry 110 preferably includes a driver 114 in the (selectable) path 112 from element 30 to multiplexer 120. The provision of this second mux 110 (i.e., in addition to mux 120) and driver 114 allows for power saving when the above-described loop-back feature is not in use. Driver 114 can be turned on (e.g., by signal C1 or a control signal derived from signal C1) when loop-back 112 is being used. Otherwise driver 114 can be turned off (e.g., again by C1 or a derivative of C1). These elements also provide additional load separation from the sensitive RX path to CDR 40. Driver 114 may be referred to as loop-back driver circuitry.

The signals C1 and C2 for controlling the routing selections made by multiplexers 110 and 120 can come from various sources. (As mentioned above, signal(s) C1 can also be used to turn on loop-back driver 114 only when that driver needs to be on. This enables driver 114 to be turned off for power saving when it does not need to be on.) For example, any or all of signals C1 and C2 can come from one or more sources that can provide "dynamic" signals (i.e., signals that are variable at various times during operation of the circuitry). An example of such a dynamic signal source is an input pin of the device that includes circuitry 10'. Another example of a dynamic signal source is the core logic circuitry 60 of the PLD that includes circuitry 10'. Alternatively, any or all of signals C1 and C2 can come from one or more sources that can provide more static signals (i.e., signals that tend to be fixed or constant rather than routinely variable (although even such so-called static signals may be changeable by re-programming the device)). An example of such a static signal source is a programmable configuration memory cell on the PLD that includes circuitry 10'.

Figure 3:
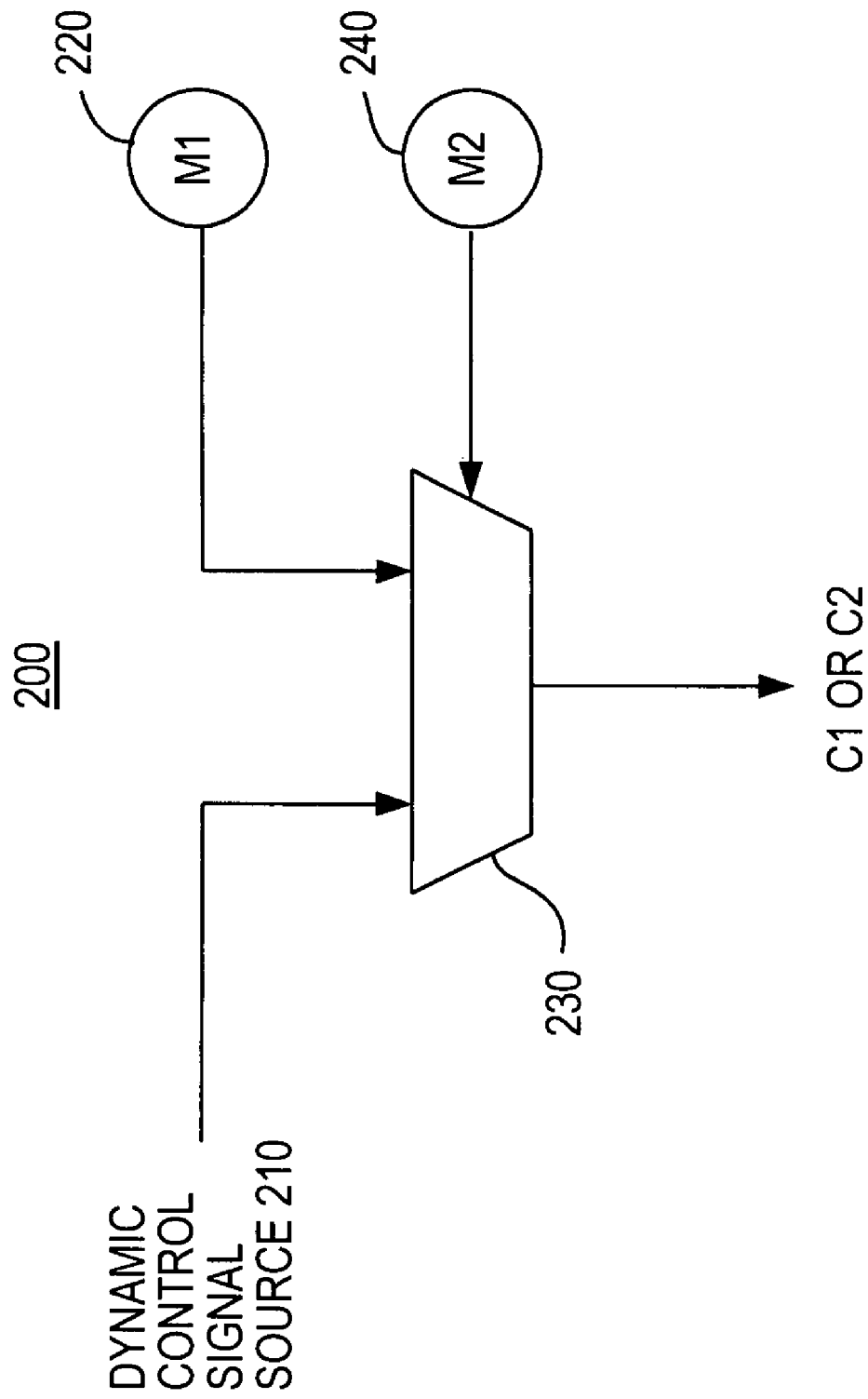
FIG. 3 is a simplified schematic block diagram showing illustrative circuitry for providing control signals of the type used in FIG. 2 in accordance with the invention.

FIG. 3 shows an example of circuitry 200 that may be included on a device that includes circuitry 10' for providing control signals like C1 and C2 in various selectable ways. Circuitry 200 includes dynamic control signal source 210 (e.g., a device input pin or an output of PLD core logic circuitry 60).

Circuitry 200 further includes a static control signal source 220 (e.g., a programmable (possibly re-programmable) PLD configuration memory cell).

Signal 210 and the output signal of source 220 are applied to the two primary (selectable) inputs to multiplexer 230. The selection-control input to multiplexer 240 comes from another source 240, which can be similar in kind to source 220. Multiplexer 230 can select either of its two primary inputs 210 or 220 to be its output signal (i.e., a C1 or C2 signal), depending on the value of its selection-control input signal 240.

Amplifying several previously mentioned points, the invention allows several operation modes to be observed. One of these is system inter-symbol interference monitoring, as well as an end-user debug feature. The quality of the equalization selection at RX 30 can be observed directly by the end-user. This can be repeated for each link to establish its quality and can greatly assist during system debug. Another operation mode that can be observed is equalizer and ADCE convergence monitoring, as well as in-house (device manufacturer) testing. Similar to the other operation mode mentioned immediately above, an internal test and characterization team can utilize this feature for yield coverage testing and device characterization.

A third operation mode that is available is the ability to use the transceiver as a link-equalizer-only in a system that requires re-transmission, or for at-speed signal splitting to multiple destinations. In this mode, buffering at mux 110 is desirable (e.g., by means of driver 114). This can allow a channel to be configured as a repeater. This is a potential end-user application feature, not just a test or debug feature. In this mode, the serial data stream can either be split into two devices (the present device and the next device in a chain connected to this TX 80), or used as a line-equalizer-only. In either case, the lowest latency of the analog equalizer 30 and the TX driver 80 is achieved, which can facilitate dealing with long and/or very attenuated links by placing such line equalizers at strategic locations along the link.

It will be understood that the foregoing is only illustrative of the principles of the invention, and that various modifications can be made by those skilled in the art without departing from the scope and spirit of the invention. For example, channel 10' may be only a representative one of several such channels that may be included on a PLD.

The invention claimed is:

1. High speed serial transceiver circuitry comprising:
input buffer circuitry including adaptive equalization capability;
data recovery circuitry for recovering data information from an output signal of the input buffer circuitry;
output driver circuitry; and
loop-back circuitry for selectively applying the output signal of the input buffer circuitry to the output driver circuitry, wherein the loop-back circuitry comprises:
loop-back driver circuitry for adding power to and thereby strengthening the output signal of the input buffer circuitry for application to the output driver circuitry, wherein the loop-back driver circuitry is turned on when the loop-back circuitry is in use for applying the output signal of the input buffer circuitry to the output driver circuitry, and is turned off to save power when the loop-back circuitry is not in use for applying the output signal of the input buffer circuitry to the output driver circuitry.

2. The circuitry defined in claim 1 further comprising:
core circuitry for receiving output of the data recovery circuitry, and for selectively providing further output usable by the output driver circuitry.

3. The circuitry defined in claim 2 wherein the loop-back circuitry comprises multiplexer circuitry for applying to the output driver circuitry a selectable one of (1) the further output, (2) output of the loop-back driver circuitry, and (3) output of the date recovery circuitry.

4. The circuitry defined in claim 1 wherein the data recovery circuitry comprises clock and data recovery circuitry.

5. The circuitry defined in claim 1 wherein the output driver circuitry includes pre-emphasis capability.

6. An integrated circuit device comprising:
first circuitry;
input buffer circuitry including adaptive equalization capability for receiving and selectively equalizing a serial input data signal;
data recovery circuitry for recovering a recovered serial data signal from an output signal of the input buffer circuitry and for applying information from the recovered serial data signal to the first circuitry;
output driver circuitry;
multiplexer circuitry for selectively applying to the output driver circuitry either (1) information output by the first circuitry, (2) the output signal of the input buffer circuitry, or (3) the recovered serial data signal; and
loop-back circuitry for selectively applying the output signal of the input buffer circuitry to the multiplexer circuitry, wherein the loop-back circuitry comprises:
loop-back driver circuitry operable to drive the output signal of the input buffer circuitry to the multiplexer circuitry, and wherein the loop-back driver circuitry is turned on when the loop-back circuitry is in use, and is turned off to save power when the loop-back circuitry is not in use.

7. The device defined in claim 6 wherein the data recovery circuitry comprises clock and data recovery circuitry.

8. The device defined in claim 6 wherein the output driver circuitry includes pre-emphasis capability.

9. An integrated circuit device comprising:
first circuitry that is at least partly programmable;
input buffer circuitry including adaptive equalization capability for receiving and selectively equalizing a serial data input signal;
clock and data recovery circuitry for recovering a recovered serial data signal from an output signal of the input buffer circuitry and for applying information from the recovered serial data signal to the first circuitry;
output driver circuitry;
multiplexer circuitry for selectively applying either of two selectable signals to the output driver circuitry, one of the selectable signals being derived from the first circuitry; and
loop-back circuitry for selectively applying a selectable one of (1) the output signal of the input buffer circuitry after passing said output signal of the input buffer circuitry through loop-back driver circuitry, and (2) the recovered serial data signal to the multiplexer circuitry as a second of the selectable signals, wherein the loopback driver circuitry is turned on when it is desired to apply the output signal of the input buffer circuitry to the multiplexer circuitry, and is otherwise turned off to save power.

10. The device defined in claim 9 wherein the output driver circuitry includes pre-emphasis capability.

11. The device defined in claim 6 wherein the integrated circuit device comprises a programmable logic device and the first circuitry comprises core logic circuitry.

12. The device defined in claim 9 wherein the integrated circuit device comprises a programmable logic device and the first circuitry comprises core logic circuitry.

\* \* \* \* \*